US006636451B2

(12) United States Patent
Park et al.

(10) Patent No.: US 6,636,451 B2
(45) Date of Patent: Oct. 21, 2003

(54) SEMICONDUCTOR MEMORY DEVICE INTERNAL VOLTAGE GENERATOR AND INTERNAL VOLTAGE GENERATING METHOD

(75) Inventors: Duk-ha Park, Kyungki-do (KR); Byung-sick Moon, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/112,003

(22) Filed: Mar. 28, 2002

(65) Prior Publication Data

US 2002/0181310 A1 Dec. 5, 2002

(30) Foreign Application Priority Data

May 31, 2001 (KR) ........................................ 2001-30521

(51) Int. Cl.7 ................................................ G11C 7/00

(52) U.S. Cl. ............. 365/226; 365/189.07; 365/189.09; 327/530; 327/538

(58) Field of Search ........................... 365/226, 189.09, 365/189.07, 189.05, 189.11, 230.06; 327/530, 536, 537, 538, 543, 108; 323/269, 313, 314

(56) References Cited

U.S. PATENT DOCUMENTS

| | | | | | |
|---|---|---|---|---|---|
| 5,367,491 | A | * | 11/1994 | Han et al. | 365/201 |
| 5,747,974 | A | * | 5/1998 | Jeon | 323/269 |
| 6,046,624 | A | * | 4/2000 | Nam et al. | 327/530 |
| 6,150,860 | A | * | 11/2000 | Chun | 327/198 |
| 6,407,538 | B1 | * | 6/2002 | Kinoshita et al. | 323/314 |
| 6,459,329 | B1 | * | 10/2002 | Kobayashi et al. | 327/538 |

* cited by examiner

*Primary Examiner*—David Nelms
*Assistant Examiner*—Gene N. Auduong
(74) *Attorney, Agent, or Firm*—Marger Johnson & McCollom, P.C.

(57) ABSTRACT

A semiconductor memory device internal voltage generator and internal voltage generating method are disclosed. The device and method are capable of supplying a uniform amount of electric charge and generating a stable internal voltage, despite variations in an external voltage. The internal voltage generator includes a PMOS driving transistor having a source connected to the external voltage, a gate connected to a driving signal, and a drain that supplies the internal voltage. The interval voltage generator also includes a driving signal generator that generates the driving signal in response to a control signal. The driving signal generator maintains a voltage between the gate and source of the PMOS driving transistor at a substantially uniform voltage level despite variations in the external voltage.

15 Claims, 2 Drawing Sheets

SEMICONDUCTOR MEMORY DEVICE INTERNAL VOLTAGE GENERATOR AND INTERNAL VOLTAGE GENERATING METHOD

BACKGROUND OF THE INVENTION

1. Field of the Invention

The present invention relates to a semiconductor memory device, and more particularly, to an internal voltage generator of a semiconductor memory device and an internal voltage generating method thereof.

2. Description of the Related Art

In most cases, semiconductor memory devices include internal voltage generators. An internal voltage generator receives an external voltage externally applied thereto and generates an internal voltage having a level lower than the external voltage. The internal voltage generated in the internal generator is used as the power voltage of a memory cell array in order to reduce power consumption, obtain high noise immunity, and insure stable operational properties.

FIG. 1 is a circuit diagram of a conventional internal voltage generator. Referring to FIG. 1, the conventional internal voltage generator includes a PMOS driving transistor P11, a comparator 11, an OR gate 13, a PMOS transistor P12, and NMOS transistors N11 and N12.

The OR gate 13 receives input signals VCCAP1 and VCCAP2 and generates a predetermined control signal VCCAE, which is a pulse type signal. The input signals VCCAP1 and VCCAP2 of the OR gate 13 are pulse signals that are generated in response to a signal activated during an active period of a semiconductor memory device.

If the NMOS transistor N11 is turned on when the predetermined control signal VCCAE is logic "high", the comparator 11 becomes active. When the input signal VCCAP2 of the OR gate 13 is logic "low", the comparator 11 compares an internal voltage VCCA fed back to the comparator 11 via the PMOS transistor P12 with a predetermined reference voltage VREF and generates a driving signal DR depending on the results. When the input signal VCCAP2 of the OR gate 13 is logic "high", the comparator 11 compares a voltage input via the NMOS transistor N12 with the reference voltage VREF and generates the driving signal DR depending on the results.

An external voltage VDD is applied to the source of the PMOS driving transistor P11, and the driving signal DR is applied to the gate of the PMOS driving transistor P11. The internal voltage VCCA is output from the drain of the PMOS driving transistor P11.

The conventional internal voltage generator shown in FIG. 1 is considerably affected, however, by variations in the external voltage VDD. For example, if the external voltage VDD increases, the gate-to-source voltage of PMOS driving transistor P11 increases, causing P11 to supply an excessive amount of electric charge. As a result, power consumption increases and the internal voltage VCCA becomes unstable.

SUMMARY OF THE INVENTION

To solve the above problems, it is a first object of the present invention to provide an internal voltage generator, for a semiconductor memory device, that can uniformly supply a predetermined amount of electric charge and can generate a stable internal voltage.

It is a second object of the present invention to provide an internal voltage generating method, for a semiconductor memory device, that can uniformly supply a predetermined amount of electric charge and can generate a stable internal voltage.

Accordingly, to achieve the first object, there is provided an internal voltage generator according to the present invention including: a PMOS driving transistor having a source to which the external voltage is applied, a gate to which a driving signal is applied, and a drain from which the internal voltage is output; and a driving signal generator that generates the driving signal. Here, the driving signal generator maintains a voltage between the gate and source of the PMOS driving transistor at a substantially uniform voltage level during variations in the external voltage.

The internal voltage generator according to the present invention may further include a pull-up device that is connected to the gate of the PMOS driving transistor and pulls up the gate of the PMOS driving transistor.

According to a preferred embodiment of the present invention, the driving signal generator includes: a voltage divider that divides the internal voltage in response to a buffered control signal so as to generate a control voltage that is substantially uniform; and an inverter that uses the external voltage as a power voltage, inverts the buffered control signal in response to the control voltage, and outputs the driving signal.

To achieve the second object, there is provided an internal voltage generating method for a semiconductor memory device that generates an internal voltage having a level lower than an external voltage, the method including: generating a control voltage that is substantially uniform by dividing the internal voltage in response to a control signal; generating a driving signal by inverting the control signal in response to the uniform control voltage using the external voltage as a power voltage; and generating the internal voltage in response to the driving signal using the external voltage as a source.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT

Figure 1:
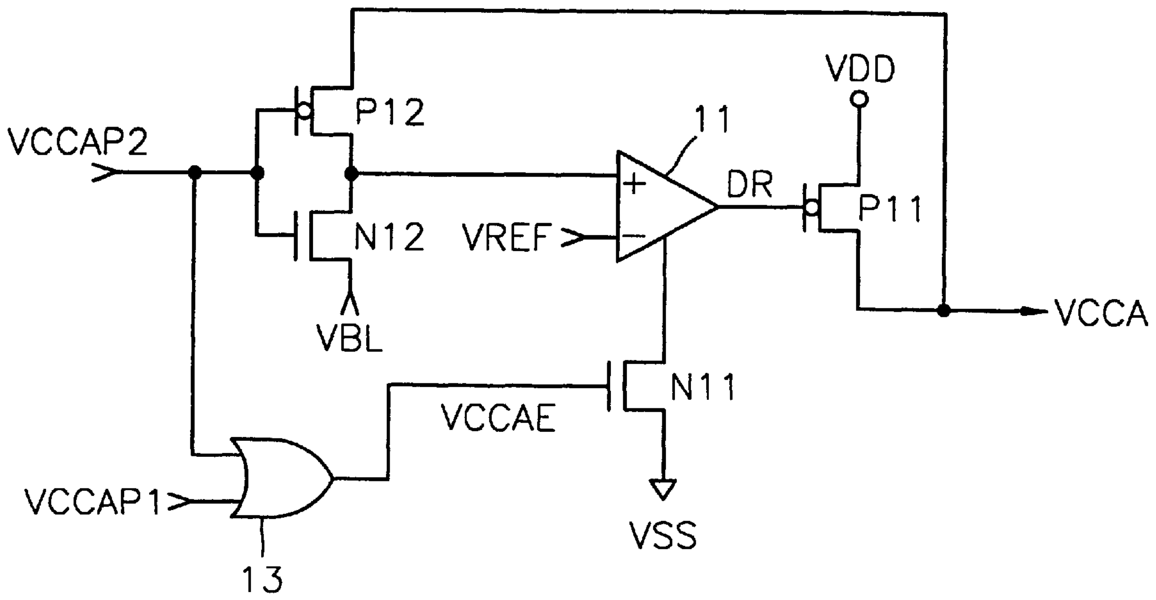
FIG. 1 (PRIOR ART)
FIG. 1 is a circuit diagram of a conventional internal voltage generator.

The present invention will now be described more fully with reference to the accompanying drawings, in which a preferred embodiment of the invention are shown. The same reference numerals in different drawings represent the same element.

Figure 2:
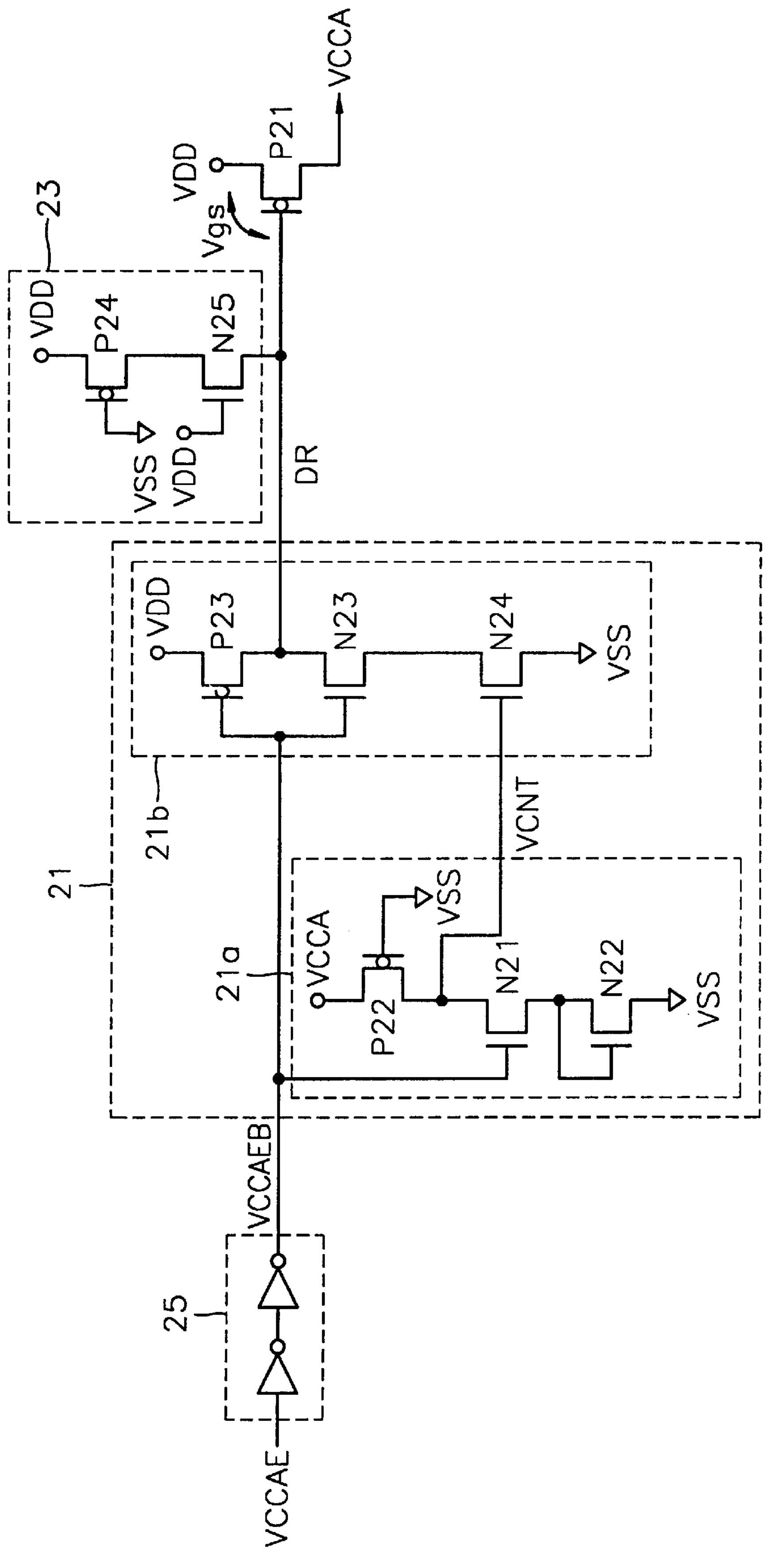
FIG. 2 is a circuit diagram of an internal voltage generator according to an embodiment of the present invention.

FIG. 2 is a circuit diagram of an internal voltage generator according to an embodiment of the present invention. Referring to FIG. 2, an internal voltage generator according to the embodiment of the present invention includes a PMOS driving transistor P21, a driving signal generator 21, a pull-up device 23, and a buffer 25.

An external voltage VDD is applied to the source of the PMOS driving transistor P21, and a driving signal DR is applied to the gate of the PMOS driving transistor P21. An internal voltage VCCA is output from the drain of the PMOS driving transistor P21. In other words, the PMOS driving transistor P21, which is an internal voltage driver, receives the external voltage VDD in response to the driving signal DR and drives the internal voltage VCCA.

The buffer 25 buffers a predetermined control signal VCCAE and outputs a buffered control signal VCCAEB. The driving signal generator 21 generates the driving signal DR in response to the buffered control signal VCCAEB output from the buffer 25. The predetermined control signal VCCAE is a pulse type signal that is generated in response to a signal activated during an active period of a semiconductor memory device.

The driving signal generator 21 maintains a stable voltage Vgs between the gate and source of the PMOS driving transistor P21, even with variations in the external voltage VDD. Specifically, the driving signal generator 21 includes a voltage divider 21*a* and an inverter 21*b*. The voltage divider 21*a* divides the internal voltage VCCA in response to the buffered control signal VCCAEB and generates a control voltage VCNT that is substantially uniform. The inverter 21*b* inverts the buffered control signal VCCAEB in response to the control voltage VCNT and outputs the driving signal DR. The inverter 21*b* uses the external voltage VDD as a power voltage.

The voltage divider 21*a* includes a PMOS transistor P22 and NMOS transistors N21 and N22. The internal voltage VCCA is applied to the source of the PMOS transistor P22. Ground voltage VSS is applied to the gate of the PMOS transistor P22. The control voltage VCNT is output from the drain of the PMOS transistor P22.

The drain of the NMOS transistor N21 is connected to the drain of the PMOS transistor P22, and the buffered control signal VCCAEB is applied to the gate of the NMOS transistor N21. The drain and gate of the NMOS transistor N22 are connected to the source of the NMOS transistor N21. The source of the NMOS transistor N22 is connected to the ground voltage VSS.

The inverter 21*b* includes a PMOS transistor P23 and NMOS transistors N23 and N24. The external voltage VDD is applied to the source of the PMOS transistor P23. The buffered control signal VCCAEB is applied to the gate of the PMOS transistor P23. The driving signal DR is output from the drain of the PMOS transistor P23.

The drain of the NMOS transistor N23 is connected to the drain of the PMOS transistor P23. The buffered control signal VCCAEB is applied to the gate of the NMOS transistor N23. The drain of the NMOS transistor N24 is connected to the source of the NMOS transistor N23. The control voltage VCNT is applied to the gate of the NMOS transistor N24. The ground voltage VSS is applied to the source of the NMOS transistor N24.

The voltage divider 21*a* and the inverter 21*b* can be embodied in many forms different from the structure described above.

The pull-up device 23 is connected to the gate of the PMOS driving transistor P21 and pulls up the gate of the PMOS driving transistor P21. As illustrated in FIG. 2, the pull-up device 23 includes a PMOS transistor P24 and an NMOS transistor N25. However, the structure of the pull-up device 23 may be varied.

The operation and internal voltage generating method of the internal voltage generator according to the present invention will now be described in detail.

When the buffered control signal VCCAEB becomes logic "high", the NMOS transistor N21 of the voltage divider 21*a* is turned on. Then the internal voltage VCCA is divided by the PMOS transistor P22 and NMOS transistors N21 and N22 of the voltage divider 21*a* acting as resistors. The divided voltage, that is, the control voltage VCNT, is output from the drain of the PMOS transistor P22.

Since the internal voltage VCCA generally has a uniform voltage level, the control voltage VCNT also has a uniform voltage level. The control voltage VCNT has a voltage level sufficient to turn on the NMOS transistor N24 of the inverter 21*b*.

The inverter 21*b* inverts the buffered control signal VCCAEB in response to the control voltage VCNT and outputs the driving signal DR. When the buffered control signal VCCAEB is logic "low", the PMOS transistor P23 of the inverter 21*b* is turned on, and thus the gate of the PMOS driving transistor P21 is pulled up to the external voltage level VDD. In other words, the driving signal DR becomes logic "high". Accordingly, the PMOS driving transistor P21 is turned off, and the internal voltage VCCA is not generated.

When the buffered control signal VCCAEB is logic "high", the NMOS transistor of the inverter 21*b* is turned on, and thus current is pumped up from the gate of the PMOS driving transistor P21 to the ground voltage VSS through the NMOS transistors N23 and N24. At this time, the control voltage VCNT is almost uniform despite variations in the external voltage VDD, and thus the pump up current is uniformly maintained as well.

Therefore, if the external voltage VDD increases, the gate voltage of the PMOS driving transistor P21 also increases by the same potential difference as the external voltage VDD. If the external voltage VDD decreases, the gate voltage of the PMOS driving transistor P21 also decreases by the same potential difference as the external voltage VDD. Accordingly, a voltage Vgs between the gate and source of the PMOS driving transistor P21 is uniformly maintained with variations in the external voltage VDD. Thus, the PMOS driving transistor P21 supplies a predetermined amount of electric charge with variations in the external voltage VDD and outputs an internal voltage VCCA that is stable.

As described above, the internal voltage generator of the present invention and the internal voltage generating method thereof can uniformly supply a predetermined amount of electric charge and generate a stable internal voltage.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A semiconductor memory device having an internal voltage generator to generate an internal voltage from an external voltage, the internal voltage lower than the external voltage, the internal voltage generator comprising:

a PMOS driving transistor having a source connected to the external voltage, a gate connected to a driving signal, and a drain that supplies the internal voltage;

a pull-up device connected between the external voltage and the gate of the PMOS driving transistor; and a driving signal generator that generates the driving signal, the driving signal generator comprising a voltage divider to divide the internal voltage so as to generate a control voltage that is substantially uniform, and a pull-down device connected to the gate of the PMOS driving transistor, the pull-down device controlled by the control voltage, wherein the driving signal generator maintains a voltage between the gate and source of the PMOS driving transistor at a substantially uniform voltage level during variations in the external voltage.

2. The memory device of claim 1, wherein the driving signal generator generates the driving signal when a control signal is enabled.

3. The memory device of claim 2, wherein the control signal is buffered.

4. The memory device of claim 2, wherein the pull-down device comprises a first NMOS transistor having a drain coupled to the gate of the PMOS driving transistor, a source connected to a ground voltage, and a gate connected to the control voltage.

5. The memory device of claim 4, wherein the pull-down device further comprises a second NMOS transistor to couple the drain of the first NMOS transistor to the gate of the PMOS driving transistor, the second NMOS transistor having its gate connected to a control signal, the second NMOS transistor responding to a first logic level of the control signal by turning off the pull-down device, and responding to a second logic level of the control signal by allowing the driving signal to be based on the control voltage.

6. The semiconductor memory device of claim 1, wherein the voltage divider responds to the first logic level of a control signal by turning off the voltage dividing function.

7. The memory device of claim 1, wherein the voltage divider comprises:

a PMOS transistor connected to the internal voltage, a gate connected to a ground voltage, and a drain that supplies the control voltage;

a first third NMOS transistor having a drain connected to the drain of the PMOS transistor; and a second fourth NMOS transistor having a drain and a gate connected to the source of the third NMOS transistor and a source to which the ground voltage is applied.

8. A semiconductor memory device having an internal voltage generator to generate an internal voltage from an external voltage, the internal voltage lower than the external voltage, the internal voltage generator comprising:

an internal voltage driver to receive the external voltage and drive the internal voltage in response to a driving signal received at a driving node;

a voltage divider to divide the internal voltage to generate a control voltage that is substantially uniform;

a pull-up device connected between the driving node and the external voltage; and a pull-down device coupled between the driving node and a ground voltage, the pull-down device controlled by the control voltage.

9. The memory device of claim 8, wherein the internal voltage driver comprises a PMOS driving transistor having a source connected to the external voltage, a gate connected to the driving signal, and a drain that supplies the internal voltage.

10. The memory device of claim 8, wherein the voltage divider comprises:

a PMOS transistor connected to the internal voltage, a gate connected to a ground voltage, and a drain that supplies the control voltage;

a first NMOS transistor having a drain connected to the drain of the PMOS transistor; and a second NMOS transistor having a drain and a gate connected to the source of the first NMOS transistor and a source to which the ground voltage is applied.

11. The memory device of claim 8, wherein the pull-down device comprises:

a first NMOS transistor having a drain that supplies the driving signal and a gate connected to a control signal; and a second NMOS transistor having a drain connected to the source of the first NMOS transistor, a gate connected to the control voltage, and a source connected to the ground voltage.

12. A semiconductor memory device internal-voltage-generating method for generating an internal voltage having a voltage level lower than an external voltage, the method comprising:

generating a control voltage that is substantially uniform by dividing the internal voltage;

generating a driving signal by dividing the external voltage between a pull-up device and a pull-down device, the resistance of the pull-down device dependent on the control voltage; and generating the internal voltage in response to the driving signal using the external voltage as a source.

13. The method of claim 12, wherein generating the driving signal occurs in response to the assertion of a control signal.

14. A method of controlling a semiconductor memory device internal voltage generator having a PMOS driving transistor with a source connected to an external voltage and a drain that supplies an internal voltage, the method comprising:

pulling up the gate of the PMOS driving transistor substantially to the external voltage through a pull-up device when a control signal is deasserted;

generating a control voltage that is substantially uniform by dividing the internal voltage, and sinking a substantially uniform amount of current through the pull-up device to a ground voltage, in response to the control voltage, when the control signal is asserted.

15. The method of claim 14, wherein generating a control voltage by dividing the internal voltage occurs only when the control signal is asserted.

* * * * *

UNITED STATES PATENT AND TRADEMARK OFFICE

CERTIFICATE OF CORRECTION

PATENT NO. : 6,636,451 B2 
DATED : October 21, 2003
INVENTOR(S) : Park et al.

It is certified that error appears in the above-identified patent and that said Letters Patent is hereby corrected as shown below:

Column 5,
Line 32, "a first third NMOS" should read -- a third NMOS --.
Line 34, "a second fourth NMOS" should read -- a fourth NMOS --.

Signed and Sealed this

Sixth Day of July, 2004

JON W. DUDAS
*Acting Director of the United States Patent and Trademark Office*